United States Patent
Matsunaga et al.

(10) Patent No.: US 12,203,158 B2
(45) Date of Patent: *Jan. 21, 2025

(54) COPPER ALLOY, COPPER ALLOY PLASTIC WORKING MATERIAL, COMPONENT FOR ELECTRONIC/ELECTRICAL DEVICE, TERMINAL, BUS BAR, LEAD FRAME, AND HEAT DISSIPATION SUBSTRATE

(71) Applicant: MITSUBISHI MATERIALS CORPORATION, Tokyo (JP)

(72) Inventors: Hirotaka Matsunaga, Kitamoto (JP); Kosei Fukuoka, Kitamoto (JP); Kazunari Maki, Kitamoto (JP); Kenji Morikawa, Aizuwakamatsu (JP); Shinichi Funaki, Aizuwakamatsu (JP); Hiroyuki Mori, Sakai (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/003,398

(22) PCT Filed: Jun. 30, 2021

(86) PCT No.: PCT/JP2021/024723
§ 371 (c)(1),
(2) Date: Dec. 27, 2022

(87) PCT Pub. No.: WO2022/004779
PCT Pub. Date: Jan. 6, 2022

(65) Prior Publication Data
US 2023/0250514 A1    Aug. 10, 2023

(30) Foreign Application Priority Data

Jun. 30, 2020 (JP) .................. 2020-112695
Jun. 30, 2020 (JP) .................. 2020-112927
Oct. 29, 2020 (JP) .................. 2020-181736

(51) Int. Cl.
*C22C 9/00* (2006.01)
*C22F 1/08* (2006.01)
(Continued)

(52) U.S. Cl.
CPC .................. *C22C 9/00* (2013.01); *C22F 1/08* (2013.01); *H01B 1/02* (2013.01); *H01B 5/02* (2013.01); *H05K 7/2039* (2013.01)

(58) Field of Classification Search
CPC .... C22C 9/00; C22F 1/08; H01B 1/02; H01B 1/026; H01B 5/02; H05K 7/2039
See application file for complete search history.

(56) References Cited

U.S. PATENT DOCUMENTS

| | | | |
|---|---|---|---|
| 2006/0198757 A1* | 9/2006 | Hiekkanen | ................ C22C 9/00 420/494 |
| 2009/0084473 A1 | 4/2009 | Aruga et al. | |

(Continued)

FOREIGN PATENT DOCUMENTS

| | | |
|---|---|---|
| CN | 1876864 A | 12/2006 |
| CN | 101014725 A | 8/2007 |

(Continued)

OTHER PUBLICATIONS

Chinese Office Action mailed Jul. 27, 2023 for the related Chinese Patent Application No. 202180045904.4 (10 pages including English translation).

(Continued)

*Primary Examiner* — Humera N. Sheikh
*Assistant Examiner* — Kevin C T Li
(74) *Attorney, Agent, or Firm* — Leason Ellis LLP; Melvin C. Garner; Mitsuhiro Haraguchi

(57) ABSTRACT

This copper alloy contains greater than 10 mass ppm and less than 100 mass ppm of Mg, with a balance being Cu and inevitable impurities, which comprise: 10 mass ppm or less (Continued)

of S, 10 mass ppm or less of P, 5 mass ppm or less of Se, 5 mass ppm or less of Te, 5 mass ppm or less of Sb, 5 mass ppm or less of Bi, and 5 mass ppm or less of As. The total amount of S, P, Se, Te, Sb, Bi, and As is 30 mass ppm or less. The mass ratio [Mg]/[S+P+Se+Te+Sb+Bi+As] is 0.6 to 50, an electrical conductivity is 97% IACS or greater. The half-softening temperature ratio $T_{LD}/T_{TD}$ is greater than 0.95 and less than 1.08. The half-softening temperature $T_{LD}$ is 210° C. or higher.

13 Claims, 1 Drawing Sheet

(51) Int. Cl.
*H01B 1/02* (2006.01)
*H01B 5/02* (2006.01)
*H05K 7/20* (2006.01)

(56) References Cited

U.S. PATENT DOCUMENTS

| | | | | |
|---|---|---|---|---|
| 2018/0187292 | A1* | 7/2018 | Matsunaga | C22C 9/00 |
| 2020/0002787 | A1 | 1/2020 | Fukuoka et al. | |
| 2023/0243018 | A1* | 8/2023 | Matsunaga | C23C 30/005 |
| | | | | 420/469 |
| 2023/0243019 | A1* | 8/2023 | Matsunaga | C09K 5/14 |
| | | | | 148/432 |
| 2023/0313341 | A1* | 10/2023 | Matsunaga | C22C 9/00 |
| | | | | 420/469 |

FOREIGN PATENT DOCUMENTS

| | | |
|---|---|---|
| CN | 101180412 A | 5/2008 |
| CN | 101437969 A | 5/2009 |
| CN | 102666888 A | 9/2012 |
| CN | 102899518 A | 1/2013 |
| CN | 104232979 A | 12/2014 |
| CN | 104302794 A | 1/2015 |
| CN | 105164292 A | 12/2015 |
| CN | 105603242 A | 5/2016 |
| CN | 105936982 A | 9/2016 |
| CN | 105992831 A | 10/2016 |
| CN | 106350696 A | 1/2017 |
| CN | 107614714 A | 1/2018 |
| JP | 49015324 B | 4/1974 |
| JP | 57089448 A | 6/1982 |
| JP | 57094537 A | 6/1982 |
| JP | 63310929 A | 12/1988 |
| JP | 03072041 A | 3/1991 |
| JP | 04280935 A | 10/1992 |
| JP | 2001152267 A | 6/2001 |
| JP | 2006169548 A | 6/2006 |
| JP | 2007113093 A | 5/2007 |
| JP | 2007177274 A | 7/2007 |
| JP | 2008255416 A | 10/2008 |
| JP | 2008255417 A | 10/2008 |
| JP | 2010031339 A | 2/2010 |
| JP | 4563508 B | 10/2010 |
| JP | 2014111810 A | 6/2014 |
| JP | 2016056414 A * | 4/2016 |
| JP | 2016125093 A | 7/2016 |
| JP | 2017179490 A | 10/2017 |
| JP | 2017186623 A | 10/2017 |
| JP | 2018070908 A | 5/2018 |
| JP | 2018197397 A | 12/2018 |
| JP | 2019029605 A | 2/2019 |
| JP | 2019178398 A | 10/2019 |
| TW | 201807209 A | 3/2018 |
| WO | 9905331 A1 | 2/1999 |
| WO | 2020122112 A1 | 6/2020 |
| WO | 2021107096 A1 | 6/2021 |
| WO | 2021107102 A1 | 6/2021 |

OTHER PUBLICATIONS

Chinese Office Action mailed Jul. 28, 2023 for the related Chinese Patent Application No. 202180045132.4 (10 pages including English translation).
Chinese Office Action mailed Jul. 28, 2023 for the related Chinese Patent Application No. 202180046181.X (11 pages including English translation).
Chinese Office Action mailed Aug. 1, 2023 for the corresponding Chinese Patent Application No. 202180045199.8 (8 pages including English translation).
International Search Report mailed Sep. 21, 2021 for the corresponding PCT International Patent Application No. PCT/JP2021/024764 (5 pages including English translation).
International Search Report mailed Sep. 14, 2021 for the corresponding PCT International Patent Application No. PCT/JP2021/024769 (5 pages including English translation).
International Search Report mailed Sep. 14, 2021 for the corresponding PCT International Patent Application No. PCT/JP2021/024723 (5 pages including English translation).
International Search Report mailed Sep. 21, 2021 for the corresponding PCT International Patent Application No. PCT/JP2021/024762 (5 pages including English translation).
International Search Report mailed Sep. 21, 2021 for the corresponding PCT International Patent Application No. PCT/JP2021/024797 (4 pages including English translation).
Chinese Office action mailed Dec. 4, 2023 for the related Chinese Patent Application No. 202180045210.0 (8 pages including English translation).
Taiwanese Office Action mailed Aug. 9, 2024 for the related Taiwanese Patent Application No. 110124042 (7 pages including English translation).
Taiwanese Office Action mailed Nov. 5, 2024 for the corresponding Taiwanese Patent Application No. 110124081 (7 pages including English translation).

\* cited by examiner

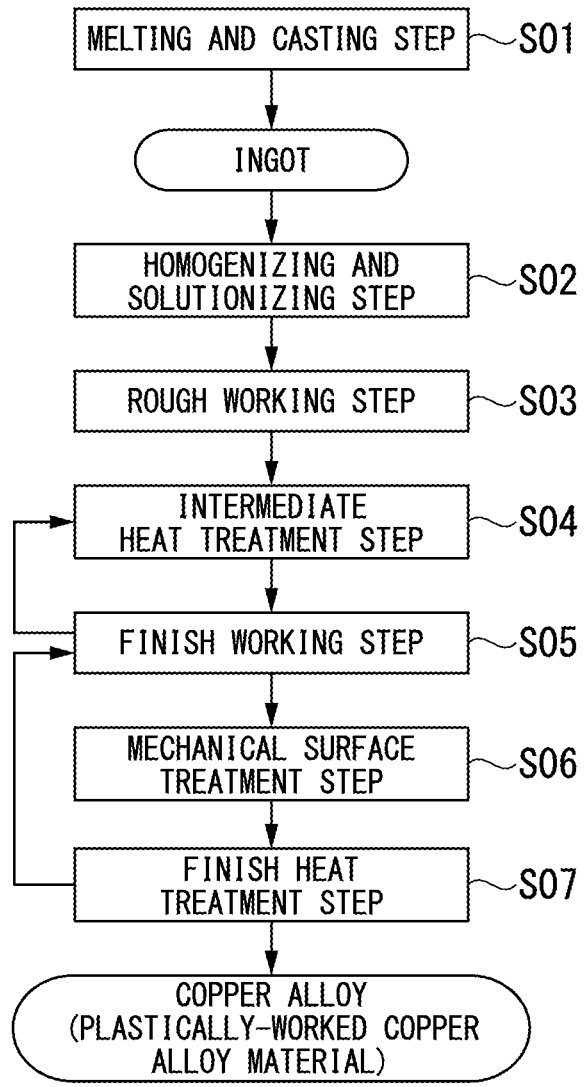

COPPER ALLOY, COPPER ALLOY PLASTIC WORKING MATERIAL, COMPONENT FOR ELECTRONIC/ELECTRICAL DEVICE, TERMINAL, BUS BAR, LEAD FRAME, AND HEAT DISSIPATION SUBSTRATE

CROSS-REFERENCE TO RELATED PATENT APPLICATIONS

This application is a U.S. National Phase Application under 35 U.S.C. § 371 of International Patent Application No. PCT/JP2021/024723 filed on Jun. 30, 2021 and claims the benefit of priority to Japanese Patent Applications No. 2020-112695 filed on Jun. 30, 2020, No. 2020-112927 filed on Jun. 30, 2020 and No. 2020-181736 filed on Oct. 29, 2020, the contents of all of which are incorporated herein by reference in their entireties. The International Application was published in Japanese on Jan. 6, 2022 as International Publication No. WO/2022/004779 under PCT Article 21(2).

FIELD OF THE INVENTION

The present invention relates to a copper alloy suitable for a component for electronic/electrical devices such as a terminal, a bus bar, a lead frame, a heat dissipation substrate, and the like; a plastically-worked copper alloy material; a component for electronic/electrical devices; a terminal; a bus bar; a lead frame; and a heat dissipation substrate, which include this copper alloy.

BACKGROUND OF THE INVENTION

In the related art, as a component for electronic/electrical devices such as a terminal, a bus bar, a lead frame, or a heat dissipation substrate, copper or a copper alloy with excellent electrical conductivity has been used.

With an increase in current of electronic devices and electrical devices, in order to reduce the current density and diffuse heat due to Joule heat generation, a pure copper material such as oxygen-free copper with excellent electrical conductivity is applied to a component for electronic/electrical devices used for such electronic devices and electrical devices.

In recent years, with an increase in the amount of current used for a component for electronic/electrical devices, the thickness of a used copper material has increased. With heat generation in a case of electrical conduction and an increase in temperature in a use environment, there is a demand for a copper material with excellent heat resistance indicating that the hardness is unlikely to decrease at a high temperature. Further, in a large-sized terminal, a bus bar, and a lead frame that are loaded with a high current, it is necessary to use a rolled material with less anisotropy. However, a pure copper material has a problem that the material cannot be used in a high-temperature environment due to insufficient heat resistance indicating that the hardness is unlikely to decrease at a high temperature.

Therefore, Japanese Unexamined Patent Application, First Publication No. 2016-056414 discloses a rolled copper plate containing 0.005% by mass or greater and less than 0.1% by mass of Mg.

The rolled copper plate described in Japanese Unexamined Patent Application, First Publication No. 2016-056414 has a composition including 0.005% by mass or greater and less than 0.1% by mass of Mg with the balance being Cu and inevitable impurities, and thus the stress relaxation resistance can be improved without greatly decreasing the electrical conductivity by dissolving Mg in a Cu matrix.

Meanwhile, recently, a copper material constituting the component for electronic/electrical devices is required to further improve the electrical conductivity in order to use the copper material for applications where the pure copper material has been used, and in order to sufficiently suppress heat generation in a case where a high current flows. In the copper alloy described in Japanese Unexamined Patent Application, First Publication No. 2016-056414, since the stress relaxation resistance is improved by adding a solute element, the electrical conductivity thereof is inferior to that of pure copper. Therefore, development of a material with higher electrical conductivity and high heat resistance which is capable of dealing with heat generation due to an increase in current has been desired.

Further, since the above-described component for electronic/electrical devices is likely to be used in a high-temperature environment such as an engine room, the copper material constituting the component for electronic/electrical devices is required to improve the heat resistance more than before.

Further, there is a demand for a copper alloy with less anisotropy in heat resistance in order to stably use a component for electronic/electrical devices in various shapes.

PRIOR ART DOCUMENTS

Patent Document

Patent Document 1: Japanese Unexamined Patent Application, First Publication No. 2016-056414

Problems to be Solved by the Invention

The present invention has been made in view of the above-described circumstances, and an object thereof is to provide a copper alloy, a plastically-worked copper alloy material, a component for electronic/electrical devices, a terminal, a bus bar, a lead frame, and a heat dissipation substrate, which have high electrical conductivity, excellent heat resistance, and less anisotropy in heat resistance.

SUMMARY OF THE INVENTION

Solutions for Solving the Problems

As a result of intensive research conducted by the present inventors in order to achieve the above-described object, it was found that addition of a small amount of Mg and regulation of the amount of an element generating a compound with Mg are required to achieve the balance between the high electrical conductivity and the excellent heat resistance. That is, it was found that the electrical conductivity and the heat resistance can be further improved more than before in a well-balanced manner by regulating the amount of an element generating a compound with Mg and allowing the small amount of Mg that has been added to be present in the copper alloy in an appropriate form.

The present invention has been made based on the above-described findings. According to an aspect of the present invention, there is provided a copper alloy having a composition including Mg in an amount of greater than 10 mass ppm and less than 100 mass ppm, with a balance being Cu and inevitable impurities, in which among the inevitable impurities, an amount of S is 10 mass ppm or less, an amount of P is 10 mass ppm or less, an amount of Se is 5 mass ppm or less, an amount of Te is 5 mass ppm or less, an amount of Sb is 5 mass ppm or less, an amount of Bi is 5 mass ppm or less, an amount of As is 5 mass ppm or less, a total amount of S, P, Se, Te, Sb, Bi, and As is 30 mass ppm or less, when the amount of Mg is represented as [Mg] and the total amount of S, P, Se, Te, Sb, Bi, and As is represented as [S+P+Se+Te+Sb+Bi+As], a mass ratio thereof, [Mg]/[S+P+Se+Te+Sb+Bi+As] is 0.6 or greater and 50 or less, an electrical conductivity is 97% IACS or greater, a half-softening temperature ratio $T_{LD}/T_{TD}$ calculated from a half-softening temperature $T_{LD}$ obtained by performing a tensile test in a direction parallel to a rolling direction and a half-softening temperature $T_{TD}$ obtained by performing a tensile test in a direction transverse to the rolling direction is greater than 0.95 and less than 1.08, and the half-softening temperature $T_{LD}$ obtained by performing the tensile test in a direction parallel to a rolling direction is 210° C. or higher.

In the aspect of the present invention, the half-softening temperature ratio $T_{LD}/T_{TD}$ is a temperature ratio in kelvin.

According to the copper alloy with the above-described configuration, since the amount of Mg and the amounts of S, P, Se, Te, Sb, Bi, and As, which are elements generating compounds with Mg, are defined as described above, the heat resistance can be improved without greatly decreasing the electrical conductivity by dissolving a small amount of added Mg in a Cu matrix. Specifically, the electrical conductivity can be set to 97% IACS or greater, and the half-softening temperature $T_{LD}$ obtained by performing the tensile test in a direction parallel to a rolling direction can be set to 210° C. or higher.

Further, since the half-softening temperature ratio $T_{LD}/T_{TD}$ calculated from the half-softening temperature $T_{LD}$ obtained by performing the tensile test in a direction parallel to a rolling direction and the half-softening temperature $T_{TD}$ obtained by performing a tensile test in a direction transverse to the rolling direction is set to be in a range of greater than 0.95 and less than 1.08, the anisotropy in heat resistance is small and the strength in a high-temperature environment can be sufficiently ensured even in a case where the heat resistance is required in both the direction parallel to the rolling direction and the direction transverse to the rolling direction, such as a terminal or a bus bar for a high current.

Further, in the copper alloy according to the aspect of the present invention, it is preferable that an amount of Ag is 5 mass ppm or greater and 20 mass ppm or less.

In this case, since the amount of Ag is in the above-described range, Ag segregates in the vicinity of grain boundaries, grain boundary diffusion is suppressed, and the heat resistance can be improved.

Further, in the copper alloy according to the aspect of the present invention, it is preferable that an area ratio of crystals having a crystal orientation which is 10° or less with respect to Brass orientation {110} <112> is 30% or less.

In this case, since the area ratio of crystals having a crystal orientation which is 10° or less with respect to Brass orientation {110} <112> is limited to 30% or less, the anisotropy in heat resistance can be suppressed. In addition, it is possible to suppress the strength in a direction transverse to the rolling direction from being preferentially increased and to suppress occurrence of anisotropy in strength.

Further, in the copper alloy according to the aspect of the present invention, it is preferable that a strength ratio $TS_{TD}/TS_{LD}$ calculated from a tensile strength $TS_{TD}$ in a case of performing a tensile test in the direction transverse to the rolling direction and a tensile strength $TS_{LD}$ in a case of performing the tensile test in the direction parallel to the rolling direction is greater than 0.93 and less than 1.10 and that a tensile strength $TS_{LD}$ in a case of performing a tensile test in the direction parallel to the rolling direction is 200 MPa or greater.

In this case, since the strength ratio $TS_{TD}/TS_{LD}$ calculated from the tensile strength $TS_{TD}$ in a case of performing the tensile test in the direction transverse to the rolling direction and the tensile strength $TS_{LD}$ in a case of performing the tensile test in the direction parallel to the rolling direction is set to be in a range of greater than 0.93 and less than 1.10, the anisotropy in strength is small and the strength can be sufficiently ensured even in a case where the strength is required in both the direction parallel to the rolling direction and the direction transverse to the rolling direction, such as a terminal or a bus bar for a high current.

Further, since the tensile strength $TS_{LD}$ in a case of performing the tensile test in the direction parallel to the rolling direction is set to 200 MPa or greater, the strength is sufficiently excellent.

A plastically-worked copper alloy material according to one aspect of the present invention includes the copper alloy described above.

According to the plastically-worked copper alloy material with the above-described configuration, since the plastically-worked copper alloy material includes the above-described copper alloy, the plastically-worked copper alloy material has excellent electrical conductivity, excellent heat resistance, and small anisotropy in heat resistance, and thus is particularly suitable as a material of a component for electronic/electrical devices, such as a terminal, a bus bar, a lead frame, or a heat dissipation substrate, used for high-current applications in a high-temperature environment.

The plastically-worked copper alloy material according to the aspect of the present invention may be a rolled plate having a thickness of 0.1 mm or greater and 10 mm or less.

In this case, since the plastically-worked copper alloy material is a rolled plate having a thickness of 0.1 mm or greater and 10 mm or less, a component for electronic/electrical devices, such as a terminal, a bus bar, a lead frame, or a heat dissipation substrate, can be molded by subjecting the plastically-worked copper alloy material (rolled plate) to punching or bending.

In regard to the plastically-worked copper alloy material according to the aspect of the present invention, it is preferable that the plastically-worked copper alloy material includes a Sn plating layer or an Ag plating layer on a surface thereof.

That is, it is preferable that the plastically-worked copper alloy material according to the aspect of the present invention includes a main body of the plastically-worked copper alloy material and a Sn plating layer or Ag plating layer provided on the surface of the main body. The main body may be a rolled plate consisting of the copper alloy described above and having a thickness of 0.1 mm or greater and 10 mm or less. In this case, since the plastically-worked copper alloy material includes a Sn plating layer or an Ag plating layer on the surface thereof, the plastically-worked copper alloy material is particularly suitable as a material of a component for electronic/electrical devices, such as a terminal, a bus bar, a lead frame, or a heat dissipation substrate. Further, according to one aspect of the present invention, the concept of "Sn plating" includes pure Sn plating or Sn alloy plating and the concept of "Ag plating" includes pure Ag plating or Ag alloy plating.

A component for electronic/electrical devices according to one aspect of the present invention includes the plastically-worked copper alloy material described above. Further, examples of the component for electronic/electrical devices according to the aspect of the present invention include a terminal, a bus bar, a lead frame, and a heat dissipation substrate.

The component for electronic/electrical devices with the above-described configuration is produced by using the above-described plastically-worked copper alloy material, and thus the component can exhibit excellent characteristics even in a case of being used for high-current applications in a high-temperature environment.

A terminal according to one aspect of the present invention includes the plastically-worked copper alloy material described above.

The terminal with the above-described configuration is produced by using the plastically-worked copper alloy material described above, and thus the terminal can exhibit excellent characteristics even in a case of being used for high-current applications in a high-temperature environment.

A bus bar according to one aspect of the present invention includes the plastically-worked copper alloy material described above.

The bus bar with the above-described configuration is produced by using the plastically-worked copper alloy material described above, and thus the bus bar can exhibit excellent characteristics even in a case of being used for high-current applications in a high-temperature environment.

A lead frame according to one aspect of the present invention includes the plastically-worked copper alloy material described above.

The lead frame with the above-described configuration is produced by using the plastically-worked copper alloy material described above, and thus the lead frame can exhibit excellent characteristics even in a case of being used for high-current applications in a high-temperature environment.

A heat dissipation substrate according to one aspect of the present invention is prepared by using the copper alloy described above.

The heat dissipation substrate with the above-described configuration is prepared by using the copper alloy described above, and thus the heat dissipation substrate can exhibit excellent characteristics even in a case of being used for high-current applications in a high-temperature environment.

Effects of Invention

According to the aspect of the present invention, it is possible to provide a copper alloy, a plastically-worked copper alloy material, a component for electronic/electrical devices, a terminal, a bus bar, a lead frame, and a heat dissipation substrate, which have high electrical conductivity, excellent heat resistance, and less anisotropy in heat resistance.

BRIEF DESCRIPTION OF THE DRAWING

The FIGURE is a flow chart showing a method for producing a copper alloy according to the present embodiment.

DETAILED DESCRIPTION OF THE INVENTION

Hereinafter, a copper alloy according to an embodiment of the present invention will be described.

The copper alloy according to the present embodiment is a copper alloy which has a composition including Mg in an amount of greater than 10 mass ppm and less than 100 mass ppm, with a balance being Cu and inevitable impurities, in which among the inevitable impurities, the amount of S is 10 mass ppm or less, the amount of P is 10 mass ppm or less, the amount of Se is 5 mass ppm or less, the amount of Te is 5 mass ppm or less, the amount of Sb is 5 mass ppm or less, the amount of Bi is 5 mass ppm or less, and the amount of As is 5 mass ppm or less, and the total amount of S, P, Se, Te, Sb, Bi, and As is 30 mass ppm or less.

Further, when the amount of Mg is represented as [Mg] and the total amount of S, P, Se, Te, Sb, Bi, and As is represented as [S+P+Se+Te+Sb+Bi+As], the mass ratio thereof, [Mg]/[S+P+Se+Te+Sb+Bi+As] is 0.6 or greater and 50 or less.

Further, in the copper alloy according to the present embodiment, the amount of Ag may be 5 mass ppm or greater and 20 mass ppm or less.

Further, the copper alloy according to the present embodiment has an electrical conductivity of 97% IACS or greater.

Furthermore, in the copper alloy according to the present embodiment, the half-softening temperature $T_{LD}$ obtained by performing the tensile test in a direction parallel to a rolling direction is set to 210° C. or higher.

In the copper alloy according to the present embodiment, the half-softening temperature ratio $T_{LD}/T_{TD}$ calculated from the half-softening temperature $T_{LD}$ obtained by performing the tensile test in a direction parallel to a rolling direction and the half-softening temperature $T_{TD}$ obtained by performing a tensile test in a direction transverse to the rolling direction is set to be in a range of greater than 0.95 and less than 1.08.

Further, the half-softening temperature ratio $T_{LD}/T_{TD}$ in the present embodiment is a temperature ratio in kelvin.

Further, in the copper alloy according to the present embodiment, it is preferable that the area ratio of crystals having a crystal orientation which is 10° or less with respect to Brass orientation {110} <112> is set to 30% or less.

Further, in the copper alloy according to the present embodiment, it is preferable that the strength ratio $TS_{TD}/TS_{LD}$ calculated from the tensile strength $TS_{TD}$ in a case of performing the tensile test in the direction transverse to the rolling direction and the tensile strength $TS_{LD}$ in a case of performing the tensile test in the direction parallel to the rolling direction is set to be in a range of greater than 0.93 and less than 1.10.

Further, in the copper alloy according to the present embodiment, it is preferable that the tensile strength $TS_{LD}$ in a case of performing the tensile test in the direction parallel to the rolling direction is 200 MPa or greater.

In the copper alloy according to the present embodiment, the reasons for specifying the component composition, the texture, and various characteristics as described above will be described.

(Mg)

Mg is an element having an effect of improving the strength and the heat resistance without greatly decreasing the electrical conductivity by being dissolved in the Cu matrix.

In a case where the amount of Mg is 10 mass ppm or less, there is a concern that the effect may not be sufficiently exhibited. On the contrary, in a case where the amount of Mg is 100 mass ppm or greater, the electrical conductivity may be decreased.

As described above, in the present embodiment, the amount of Mg is set to be in a range of greater than 10 mass ppm and less than 100 mass ppm.

In order to further improve the heat resistance, the lower limit of the amount of Mg is set to preferably 20 mass ppm or greater, more preferably 30 mass ppm or greater, and still more preferably 40 mass ppm or greater.

Further, in order to further increase the electrical conductivity, the upper limit of the amount of Mg is preferably less than 90 mass ppm. In a case where the electrical conductivity is increased, the upper limit of the amount of Mg is more preferably less than 80 mass ppm and more preferably less than 70 mass ppm in order to achieve the balance between the electrical conductivity, the heat resistance, and the stress relaxation characteristic.

(S, P, Se, Te, Sb, Bi, and As)

The elements such as S, P, Se, Te, Sb, Bi, and As described above are elements that are typically easily mixed into a copper alloy. These elements are likely to react with Mg to form a compound, and thus may reduce the solid-solution effect of a small amount of added Mg. Therefore, the amounts of these elements are required to be strictly controlled.

Therefore, in the present embodiment, the amount of S is limited to 10 mass ppm or less, the amount of P is limited to 10 mass ppm or less, the amount of Se is limited to 5 mass ppm or less, the amount of Te is limited to 5 mass ppm or less, the amount of Sb is limited to 5 mass ppm or less, the amount of Bi is limited to 5 mass ppm or less, and the amount of As is limited to 5 mass ppm or less.

Further, the total amount of S, P, Se, Te, Sb, Bi, and As is limited to 30 mass ppm or less.

The lower limits of the amounts of the above-described elements are not particularly limited, but the amount of each of S, P, Sb, Bi, and As is preferably 0.1 mass ppm or greater and more preferably 0.2 mass ppm or greater from the viewpoint that the production cost is increased in order to greatly reduce the amounts of the above-described elements. The amount of Se is preferably 0.05 mass ppm or greater and more preferably 0.1 mass ppm or greater. The amount of Te is preferably 0.01 mass ppm or greater and more preferably 0.05 mass ppm or greater.

The lower limit of the total amount of S, P, Se, Te, Sb, Bi, and As is not particularly limited, but the total amount of S, P, Se, Te, Sb, Bi, and As is preferably 0.6 mass ppm or greater and more preferably 1.0 mass ppm or greater from the viewpoint that the production cost is increased in order to greatly reduce the total amount thereof.

Further, the amount of S is preferably 9 mass ppm or less and more preferably 8 mass ppm or less.

The amount of P is preferably 6 mass ppm or less and more preferably 3 mass ppm or less.

The amount of Se is preferably 4 mass ppm or less and more preferably 2 mass ppm or less.

The amount of Te is preferably 4 mass ppm or less and more preferably 2 mass ppm or less.

The amount of Sb is preferably 4 mass ppm or less and more preferably 2 mass ppm or less.

The amount of Bi is preferably 4 mass ppm or less and more preferably 2 mass ppm or less.

The amount of As is preferably 4 mass ppm or less and more preferably 2 mass ppm or less.

Further, the total amount of S, P, Se, Te, Sb, Bi, and As is preferably 24 mass ppm or less and more preferably 18 mass ppm or less.

$([Mg]/[S+P+Se+Te+Sb+Bi+As])$

As described above, since elements such as S, P, Se, Te, Sb, Bi, and As easily react with Mg to form compounds, the existence form of Mg is controlled by defining the ratio between the amount of Mg and the total amount of S, P, Se, Te, Sb, Bi, and As in the present embodiment.

When the amount of Mg is represented as [Mg] and the total amount of S, P, Se, Te, Sb, Bi, and As is represented as [S+P+Se+Te+Sb+Bi+As], in a case where the mass ratio thereof, [Mg]/[S+P+Se+Te+Sb+Bi+As] is greater than 50, Mg is excessively present in copper in a solid solution state, and thus the electrical conductivity may be decreased. On the contrary, in a case where the mass ratio thereof, [Mg]/[S+P+Se+Te+Sb+Bi+As] is less than 0.6, Mg is not sufficiently dissolved in copper, and thus the heat resistance may not be sufficiently improved.

Therefore, in the present embodiment, the mass ratio [Mg]/[S+P+Se+Te+Sb+Bi+As] is set to be in a range of 0.6 or greater and 50 or less.

In addition, the amount of each element in the above-described mass ratio is in units of mass ppm.

In order to further suppress a decrease in electrical conductivity, the upper limit of the mass ratio [Mg]/[S+P+Se+Te+Sb+Bi+As] is preferably 35 or less and more preferably 25 or less.

Further, in order to further improve the heat resistance, the lower limit of the mass ratio [Mg]/[S+P+Se+Te+Sb+Bi+As] is set to preferably 0.8 or greater and more preferably 1.0 or greater.

(Ag: 5 Mass Ppm or Greater and 20 Mass Ppm or Less)

Ag is unlikely to be dissolved in the Cu matrix in a temperature range of 250° C. or lower, in which typical electronic/electrical devices are used. Therefore, a small amount of Ag added to copper segregates in the vicinity of grain boundaries. In this manner, since movement of atoms at grain boundaries is hindered and grain boundary diffusion is suppressed, the heat resistance is improved.

In a case where the amount of Ag is 5 mass ppm or greater, the effects can be sufficiently exhibited. On the contrary, in a case where the amount of Ag is 20 mass ppm or less, the electrical conductivity can be ensured and an increase in production cost can be suppressed.

As described above, in the present embodiment, the amount of Ag is set to be in a range of 5 mass ppm or greater and 20 mass ppm or less.

In order to further improve the heat resistance, the lower limit of the amount of Ag is set to preferably 6 mass ppm or greater, more preferably 7 mass ppm or greater, and still more preferably 8 mass ppm or greater. Further, in order to reliably suppress a decrease in the electrical conductivity and an increase in cost, the upper limit of the amount of Ag is set to preferably 18 mass ppm or less, more preferably 16 mass ppm or less, and still more preferably 14 mass ppm or less.

Further, in a case where Ag is not intentionally included and the inevitable impurities include Ag, the amount of Ag may be less than 5 mass ppm.

(Other Inevitable Impurities)

Examples of other inevitable impurities other than the above-described elements include Al, B, Ba, Be, Ca, Cd, Cr, Sc, rare earth elements, V, Nb, Ta, Mo, Ni, W, Mn, Re, Ru, Sr, Ti, Os, Co, Rh, Ir, Pb, Pd, Pt, Au, Zn, Zr, Hf, Hg, Ga, In, Ge, Y, Tl, N, Si, Sn, and Li. The copper alloy may contain inevitable impurities within a range not affecting the characteristics.

Since there is a concern that the electrical conductivity is decreased, it is preferable that the amount of the inevitable impurities is reduced.

(Half-Softening Temperature Ratio $T_{LD}/T_{TD}$: Greater than 0.95 and Less than 1.08)

in the Present Embodiment, Since the Half-Softening Temperature Ratio $T_{LD}/T_{TD}$ calculated from the half-softening temperature $T_{LD}$ obtained by performing the tensile test in a direction parallel to a rolling direction and the half-softening temperature $T_{TD}$ obtained by performing a tensile test in a direction transverse to the rolling direction is set to be in a range of greater than 0.95 and less than 1.08, the anisotropy in heat resistance is small and the strength in a high-temperature environment can be sufficiently ensured in both the direction parallel to the rolling direction and the direction transverse to the rolling direction.

In order to reliably exhibit the above-described effect, the lower limit of the half-softening temperature ratio $T_{LD}/T_{TD}$ is set to preferably 0.97 or greater and more preferably 0.98 or greater. On the contrary, the upper limit of the half-softening temperature ratio $T_{LD}/T_{TD}$ is set to preferably 1.06 or less and more preferably 1.04 or less.

(Electrical Conductivity: 97% IACS or Greater)

In the copper alloy according to the present embodiment, the electrical conductivity is 97% IACS or greater. The heat generation in a case of electrical conduction is suppressed by setting the electrical conductivity to 97% IACS or greater so that the copper alloy can be satisfactorily used as a component for electronic/electrical devices such as a terminal, a bus bar, a lead frame, or a heat dissipation substrate as a substitute to a pure copper material.

The electrical conductivity is preferably 97.5% IACS or greater, more preferably 98.0% IACS or greater, still more preferably 98.5% IACS or greater, and even still more preferably 99.0% IACS or greater.

The upper limit of the electrical conductivity is not particularly limited, but is preferably 103.0% IACS or less.

(Half-Softening Temperature $T_{LD}$ Obtained by Performing Tensile Test in Direction Parallel to Rolling Direction: 210° C. or Higher)

In the copper alloy according to the present embodiment, in a case where the half-softening temperature $T_{LD}$ obtained by performing the tensile test in a direction parallel to the rolling direction is high, recovery in the copper material and softening phenomenon due to recrystallization are unlikely to occur even at a high temperature; and therefore, the copper alloy can be applied to an electric conductive member used in a high-temperature environment.

Therefore, in the present embodiment, the half-softening temperature $T_{LD}$ obtained by performing the tensile test in a direction parallel to the rolling direction is set to 210° C. or higher.

Further, the half-softening temperature $T_{LD}$ obtained by performing the tensile test in a direction parallel to the rolling direction is more preferably 225° C. or higher, still more preferably 250° C. or higher, and even still more preferably 275° C. or higher.

The upper limit of the half-softening temperature $T_{LD}$ is not particularly limited, but is preferably 600° C. or lower.

(Strength Ratio $TS_{TD}/TS_{LD}$: Greater than 0.93 and Less than 1.10)

In a case where the strength ratio $TS_{TD}/TS_{LD}$ calculated from the tensile strength $TS_{TD}$ in a case of performing the tensile test in the direction transverse to the rolling direction and the tensile strength $TS_{LD}$ in a case of performing the tensile test in the direction parallel to the rolling direction is set to be in a range of greater than 0.93 and less than 1.10, the anisotropy in strength is small and the strength is sufficiently ensured even in a case where the strength is required in both the LD direction (direction parallel to the rolling direction) and the TD direction (direction transverse to the rolling direction), such as a terminal or a bus bar for a high current.

In order to reliably exhibit the above-described effect, the lower limit of the strength ratio $TS_{TD}/TS_{LD}$ is set to more preferably 0.95 or greater and still more preferably 0.98 or greater. Further, the upper limit of the strength ratio $TS_{TD}/TS_{LD}$ is set to more preferably 1.08 or less and still more preferably 1.06 or less.

(Tensile Strength $TS_{LD}$ in Direction Parallel to Rolling Direction: 200 MPa or Greater)

In the copper alloy according to the present embodiment, in a case where the tensile strength $TS_{LD}$ in the direction parallel to the rolling direction is 200 MPa or greater, the copper alloy is particularly suitable as a material of a component for electronic/electrical devices such as a terminal, a bus bar, or a lead frame. Particularly, the upper limit of the tensile strength $TS_{LD}$ in the direction parallel to the rolling direction is not specified, but it is preferable that the tensile strength $TS_{LD}$ is set to 500 MPa or less in order to avoid a decrease in productivity due to a winding habit of coil in a case where a coiled strip material is used.

Further, the lower limit of the tensile strength $TS_{LD}$ in the direction parallel to the rolling direction is more preferably 275 MPa or greater and still more preferably 300 MPa or greater.

(Brass Orientation {110} <112>: 30% or Less)

As the Brass orientation increases, the strength in the direction transverse to the rolling direction increases. Therefore, in order to suppress anisotropy in strength, it is preferable that the area ratio of crystals having a crystal orientation which is 100 or less with respect to Brass orientation {110} <112> is set to 30% or less.

In order to further suppress anisotropy in strength, the area ratio of crystals having a crystal orientation which is 10° or less with respect to Brass orientation {110} <112> is set to preferably 20% or less and more preferably 10% or less.

Meanwhile, in a case where the ratio of the Brass orientation is extremely small, since the strength in the direction transverse to the rolling direction is extremely decreased and thus required strength may not be ensured, the lower limit of the area ratio of crystals having a crystal orientation which is 100 or less with respect to Brass orientation {110} <112> is preferably 0.5% or greater, more preferably 1% or greater, and most preferably 1.5% or greater.

Next, a method for producing the copper alloy according to the present embodiment with such a configuration will be described with reference to the flow chart shown in the drawing.

(Melting and Casting Step S01)

First, the above-described elements are added to molten copper obtained by melting the copper raw material to adjust components; and thereby, a molten copper alloy is produced. Further, a single element, a base alloy, or the like can be used for addition of various elements. In addition, raw materials containing the above-described elements may be melted together with the copper raw material. Further, a recycled material or a scrap material of the copper alloy of the present embodiment may be used.

As the copper raw material, so-called 4N Cu having a purity of 99.99% by mass or greater or so-called 5N Cu having a purity of 99.999% by mass or greater is preferably used.

During melting, in order to suppress oxidation of Mg and to reduce the hydrogen concentration, it is preferable that atmosphere-controlled melting is carried out in an atmosphere using an inert gas atmosphere (for example, Ar gas) in which the vapor pressure of $H_2O$ is low and the holding time for the melting is set to the minimum.

Then, the molten copper alloy in which the components have been adjusted is poured into a mold to produce an ingot. In consideration of mass production, it is preferable to use a continuous casting method or a semi-continuous casting method.

(Homogenizing/Solutionizing Step S02)

Next, a heat treatment is performed for homogenization and solutionization of the obtained ingot. An intermetallic compound or the like containing Cu and Mg as main components may be present inside the ingot, and the intermetallic compound is generated by segregation and concentration of Mg in the solidification process. Therefore, in order to eliminate or reduce the segregated elements and the intermetallic compound, a heat treatment of heating the ingot to 300° C. or higher and 1080° C. or lower is performed. In this manner, Mg is uniformly diffused in the ingot or Mg is dissolved in the matrix. In addition, it is preferable that the homogenizing/solutionizing step S02 is performed in a non-oxidizing or reducing atmosphere.

In a case where the heating temperature is lower than 300° C., the solutionization may be incomplete, and a large amount of the intermetallic compound containing Cu and Mg as main components may remain in the matrix. On the contrary, in a case where the heating temperature is higher than 1080° C., a part of the copper material serves a liquid phase, and thus the texture and the surface state may be non-uniform. Therefore, the heating temperature is set to be in a range of 300° C. or higher and 1080° C. or lower.

Further, hot working may be performed after the above-described homogenizing/solutionizing step S02 in order to improve the efficiency of rough working and homogenize the texture described below. In this case, the working method is not particularly limited, and for example, rolling, drawing, extruding, groove rolling, forging, and pressing can be employed. Further, it is preferable that the hot working temperature is set to be in a range of 300° C. or higher and 1080° C. or lower.

(Rough Working Step S03)

In order to work into a predetermined shape, rough working is performed. Further, the temperature conditions for this rough working step S03 are not particularly limited, but the working temperature is set to be preferably in a range of −200° C. to 200° C., in which cold working or warm working (for example, rolling) is carried out, and particularly preferably room temperature from the viewpoint of suppressing recrystallization or improving the dimensional accuracy. The working rate is preferably 20% or greater and more preferably 30% or greater. Further, the working method is not particularly limited, and for example, rolling, drawing, extruding, groove rolling, forging, and pressing can be employed.

(Intermediate Heat Treatment Step S04)

After the rough working step S03, a heat treatment is performed for softening to improve the workability or for obtaining a recrystallization structure. Further, the intermediate heat treatment step S04 and the finish working step S05 described below may be repeated.

Since this intermediate heat treatment step S04 is substantially the final recrystallization heat treatment, the crystal grain size of the recrystallization structure obtained in this step is approximately the same as the final crystal grain size. Therefore, in the intermediate heat treatment step S04, it is preferable that the heat treatment conditions are appropriately selected such that the average crystal grain size is set to 5 μm or greater. For example, it is preferable to hold for approximately 1 second to 120 seconds in a case of a temperature of 700° C.

(Finish Working Step S05)

In order to work the copper material after the intermediate heat treatment step S04 into a predetermined shape, finish working is performed. Further, the temperature conditions in this finish working step S05 are not particularly limited, but the working temperature is set to be preferably in a range of −200° C. to 200° C., in which cold working or warm working is carried out, and particularly preferably room temperature from the viewpoint of suppressing recrystallization during the working or suppressing softening.

Further, the working rate is appropriately selected such that the shape of the copper material is close to the final shape, but it is preferable that the working rate is set to 5% or greater in order to obtain work hardening or to increase the Brass orientation ratio which is the rolled texture so that the strength is improved in the finish working step S05. In order to further improve the strength, the working rate is set to more preferably 10% or greater and still more preferably 15% or greater.

Further, in order to suppress excessively orienting to the Brass orientation, the working rate is set to preferably 75% or less and more preferably 70% or less.

Further, the working method is not particularly limited, and for example, rolling, drawing, extruding, groove rolling, forging, and pressing can be employed.

(Mechanical Surface Treatment Step S06)

After the finish working step S05, a mechanical surface treatment is performed. The mechanical surface treatment is a treatment of isotropically applying a compressive stress to the vicinity of the surface after a desired shape is almost obtained, and has an effect of decreasing the anisotropy in heat resistance and strength.

As the mechanical surface treatment, various methods, which have been typically used, such as a shot peening treatment, a blasting treatment, a lapping treatment, a polishing treatment, buffing, grinder polishing, sandpaper polishing, a tension leveler treatment, and light rolling with a low rolling reduction ratio per pass (light rolling is repeatedly performed three times or more by setting the rolling reduction ratio per pass to 1% to 10%) can be used.

Further, the heat resistance is greatly improved by applying this mechanical surface treatment to the copper alloy to which Mg has been added.

(Finish Heat Treatment Step S07)

Next, a finish heat treatment may be performed on the plastically-worked material obtained by the mechanical surface treatment step S06 in order to remove segregation of contained elements to grain boundaries and to remove residual strain.

It is preferable that the heat treatment temperature is set to be in a range of 100° C. or greater and 500° C. or lower. Further, in this finish heat treatment step S07, it is necessary to set heat treatment conditions in order to avoid a large decrease in strength due to recrystallization. For example, it is preferable to hold at 450° C. for approximately 0.1 to 10 seconds and preferable to hold at 250° C. for 1 minute to 100 hours. It is preferable that the heat treatment is performed in a non-oxidizing atmosphere or a reducing atmosphere. A method of performing the heat treatment is not particularly limited, but it is preferable that the heat treatment is performed using a continuous annealing furnace for a short period of time from the viewpoint of the effect of reducing the production cost.

Further, the finish working step S05, the mechanical surface treatment step S06, and the finish heat treatment step S07 may be repeated.

In this manner, the copper alloy (plastically-worked copper alloy material) according to the present embodiment is produced. Further, the plastically-worked copper alloy material produced by rolling is referred to as a rolled copper alloy plate.

In a case where the plate thickness of the plastically-worked copper alloy material (rolled copper alloy plate) is set to 0.1 mm or greater, the plastically-worked copper alloy material is suitable for use as a conductor for high-current applications. Further, in a case where the plate thickness of the plastically-worked copper alloy material is set to 10.0 mm or less, an increase in the load of a press machine can be suppressed, the productivity per unit time can be ensured, and thus the production cost can be reduced.

Therefore, it is preferable that the plate thickness of the plastically-worked copper alloy material (rolled copper alloy plate) is set to be in a range of 0.1 mm or greater and 10.0 mm or less.

The lower limit of the plate thickness of the plastically-worked copper alloy material (rolled copper alloy plate) is set to preferably 0.5 mm or greater and more preferably 1.0 mm or greater. On the contrary, the upper limit of the plate thickness of the plastically-worked copper alloy material (rolled copper alloy plate) is set to preferably less than 9.0 mm and more preferably less than 8.0 mm.

In the copper alloy according to the present embodiment with the above-described configuration, since the amount of Mg is set to be in a range of greater than 10 mass ppm and less than 100 mass ppm, and the amount of S is set to 10 mass ppm or less, the amount of P is set to 10 mass ppm or less, the amount of Se is set to 5 mass ppm or less, the amount of Te is set to 5 mass ppm or less, the amount of Sb is set to 5 mass ppm or less, the amount of Bi is set to 5 mass ppm or less, the amount of As is set to 5 mass ppm or less, and the total amount of S, P, Se, Te, Sb, Bi, and As, which are the elements generating compounds with Mg, is limited to 30 mass ppm or less, a small amount of added Mg can be dissolved in the Cu matrix, and the heat resistance can be improved without greatly decreasing the electrical conductivity.

Further, when the amount of Mg is represented as [Mg] and the total amount of S, P, Se, Te, Sb, Bi, and As is represented as [S+P+Se+Te+Sb+Bi+As], since the mass ratio thereof [Mg]/[S+P+Se+Te+Sb+Bi+As] is set to be in a range of 0.6 or greater and 50 or less, the heat resistance can be sufficiently improved without decreasing electrical conductivity due to the dissolving of excess amount of Mg.

Therefore, according to the copper alloy of the present embodiment, the electrical conductivity can be set to 97% IACS or greater, the half-softening temperature $T_{LD}$ obtained by performing the tensile test in the direction parallel to the rolling direction can be set to 210° C. or higher, and thus both high electrical conductivity and excellent heat resistance can be achieved.

Further, since the half-softening temperature ratio $T_{LD}/T_{TD}$ calculated from the half-softening temperature $T_{LD}$ obtained by performing the tensile test in the direction parallel to the rolling direction and the half-softening temperature $T_{TD}$ obtained by performing the tensile test in the direction transverse to the rolling direction is set to be in a range of greater than 0.95 and less than 1.08, the anisotropy in heat resistance is small and the strength in a high-temperature environment can be sufficiently ensured even in a case where the heat resistance is required in both the direction parallel to the rolling direction and the direction transverse to the rolling direction, such as a terminal or a bus bar for a high current.

In the present embodiment, in a case where the amount of Ag is set to be in a range of 5 mass ppm or greater and 20 mass ppm or less, Ag is segregated in the vicinity of grain boundaries and grain boundary diffusion is suppressed by Ag; and thereby, the heat resistance can be further improved.

Further, in the present embodiment, in a case where the area ratio of crystals having a crystal orientation which is 100 or less with respect to Brass orientation {110} <112> is limited to 30% or less, it is possible to suppress the strength in a direction transverse to the rolling direction from being preferentially increased and to reliably suppress anisotropy in strength.

Further, in the present embodiment, in a case where the strength ratio $TS_{TD}/TS_{LD}$ calculated from the tensile strength $TS_{TD}$ in a case of performing the tensile test in the direction transverse to the rolling direction and the tensile strength $TS_{LD}$ in a case of performing the tensile test in the direction parallel to the rolling direction is set to be in a range of greater than 0.93 and less than 1.10, the anisotropy in strength is small and the strength is sufficiently ensured even in a case where the strength is required in both the direction parallel to the rolling direction and the direction transverse to the rolling direction, such as a terminal or a bus bar for a high current.

Further, in the present embodiment, in a case where the tensile strength $TS_{LD}$ in the direction parallel to the rolling direction is 200 MPa or greater, since the tensile strength $TS_{LD}$ in the direction parallel to the rolling direction is sufficiently high, the copper alloy is particularly suitable as a material of a component for electronic/electrical devices, such as a terminal, a bus bar, a lead frame, or a heat dissipation substrate.

Since the plastically-worked copper alloy material according to the present embodiment includes the above-described copper alloy, the plastically-worked copper alloy material has excellent electrical conductivity, excellent heat resistance, and small anisotropy in heat resistance, and thus is particularly suitable as a material of a component for electronic/electrical devices, such as a terminal, a bus bar, a lead frame, or a heat dissipation substrate.

Further, in a case where the plastically-worked copper alloy material according to the present embodiment is a rolled plate having a thickness of 0.1 mm or greater and 10 mm or less, a component for electronic/electrical devices, such as a terminal, a bus bar, a lead frame, or a heat dissipation substrate, can be relatively easily molded by subjecting the plastically-worked copper alloy material (rolled plate) to punching or bending.

Further, in a case where a Sn plating layer or an Ag plating layer is formed on the surface of the plastically-worked copper alloy material according to the present embodiment, the plastically-worked copper alloy material is particularly suitable as a material of a component for electronic/electrical devices, such as a terminal, a lead frame, a bus bar, or a heat dissipation substrate.

Further, the component for electronic/electrical devices (such as a terminal, a bus bar, a lead frame, or a heat dissipation substrate) according to the present embodiment includes the above-described plastically-worked copper alloy material, and thus can exhibit excellent characteristics even in a case of being used for high-current applications in a high-temperature environment.

In addition, the heat dissipation substrate may be prepared by using the above-described copper alloy.

Hereinbefore, the copper alloy, the plastically-worked copper alloy material, and the component for electronic/electrical devices (such as a terminal, a bus bar, a lead frame, or a heat dissipation substrate) according to the embodiment of the present invention have been described, but the present invention is not limited thereto and can be appropriately changed within a range not departing from the technical features of the invention.

For example, in the above-described embodiment, the example of the method for producing the copper alloy (plastically-worked copper alloy material) has been described, but the method for producing the copper alloy is not limited to the description of the embodiment, and the copper alloy may be produced by appropriately selecting a production method of the related art.

EXAMPLES

Hereinafter, results of a verification test conducted to verify the effects of the present embodiment will be described.

A raw material consisting of pure copper having a purity of 99.999% by mass or greater which had been obtained by a zone melting refining method was charged into a high-purity graphite crucible and subjected to high-frequency induction melting in an Ar gas atmosphere furnace.

A base alloy containing 0.1% by mass of various additive elements was prepared by using a high-purity copper with 6N (purity of 99.9999% by mass) or greater and a pure metal with 2N (purity of 99% by mass) or greater. An ingot having the component composition listed in Tables 1 and 2 was produced by adding the base alloy to the obtained molten copper to adjust the component and pouring the molten copper into a heat insulating material (refractory material) mold. Further, the size of the ingot was set such that the thickness was approximately 30 mm, the width was approximately 60 mm, and the length was approximately in a range of 150 to 200 mm.

The obtained ingot was heated at 900° C. for 1 hour in an Ar gas atmosphere in order to solutionize Mg, and the surface was ground to remove the oxide film, and the ingot was cut into a predetermined size.

Thereafter, the thickness of the ingot was appropriately adjusted to obtain the final thickness, and the ingot was cut. Each of the cut specimens were subjected to rough rolling under the conditions listed in Tables 3 and 4. Next, an intermediate heat treatment was performed under the condition that the crystal grain size was set to approximately 30 μm by recrystallization.

Next, finish rolling (finish working step) was performed under the conditions listed in Tables 3 and 4.

Next, these specimens were subjected to a mechanical surface treatment step by the method listed in Tables 3 and 4.

Further, sandpaper polishing was performed using #180 abrasive paper.

The grinder polishing was performed using a #400 bearing wheel at a speed of 4500 revolutions per minute.

The shot peening treatment was performed at a projection speed of 10 m/sec for a projection time of 10 seconds using a stainless steel shot having a diameter of 0.3 mm.

Thereafter, a finish heat treatment was performed under the conditions listed in Tables 3 and 4 to produce a strip material having a thickness listed in Tables 3 and 4 and a width of approximately 60 mm.

The obtained strip materials were evaluated for the following items.

(Composition Analysis)

A measurement specimen was collected from the obtained ingot, the amount of Mg was measured by inductively coupled plasma atomic emission spectrophotometry, and the amounts of other elements were measured using a glow discharge mass spectrometer (GD-MS). Further, the measurement was performed at two sites, the center portion of the specimen and the end portion of the specimen in the width direction, and the larger amount was defined as the amount of the sample. As a result, it was confirmed that the component compositions were as listed in Tables 1 and 2.

(Brass Orientation Ratio)

The Brass orientation ratio was measured in the following manner by using a surface transverse to the rolling width direction, that is, a transverse direction (TD) surface as an observation surface with an EBSD measuring device and OIM analysis software.

Mechanical polishing was performed using waterproof abrasive paper and diamond abrasive grains, and finish polishing was performed using a colloidal silica solution. Thereafter, the observation surface was measured in a measurement area of 1 mm$^2$ or greater at every measurement interval of 3 μm at an electron beam acceleration voltage of 20 kV by an EBSD method using an EBSD measuring device (Quanta FEG 450, manufactured by FEI, OIM Data Collection, manufactured by EDAX/TSL (currently AMETEK)) and analysis software (OIM Data Analysis ver. 7.3.1, manufactured by EDAX/TSL (currently AMETEK)). The measured results were analyzed by the data analysis software OIM to obtain CI values at each measurement point. The measurement points in which the CI value was 0.1 or less were removed, and the orientation of each crystal grain was analyzed by the data analysis software OIM. It was determined whether or not each analysis point had a targeted Brass orientation (within 10° from the ideal orientation), and the Brass orientation ratio (crystal orientation area ratio) in the measurement region was acquired. Specifically, the Brass orientation ratio was the ratio of measurement points having a crystal orientation which was in a range of −10° to +10° from the ideal orientation {110} <112> of the Brass orientation among all the measurement points.

(Electrical Conductivity)

Test pieces having a width of 10 mm and a length of 60 mm were collected from each strip material for characteristic evaluation and the electric resistance was acquired according to a 4 terminal method. Further, the dimension of each test piece was measured using a micrometer and the volume of the test piece was calculated. Then, the electrical conductivity was calculated from the measured electric resistance value and volume. Further, the test pieces were collected such that the longitudinal directions thereof were parallel to the rolling direction of each strip material for characteristic evaluation. The evaluation results are listed in Tables 3 and 4.

(Strength Ratio)

13B test pieces specified in JIS Z 2241 were collected from each strip material for characteristic evaluation in a direction parallel to the rolling direction and a direction transverse to the rolling direction, and the tensile strength was measured by the offset method in JIS Z 2241. The strength ratio $TS_{TD}/TS_{LD}$ was calculated from the tensile strength $TS_{TD}$ in a case of performing the tensile test in the direction transverse to the rolling direction and the tensile strength $TS_{LD}$ in a case of performing the tensile test in the direction parallel to the rolling direction.

The strength ratio $TS_{TD}/TS_{LD}$ and the tensile strength $TS_{LD}$ in a case of performing the tensile test in the direction parallel to the rolling direction are listed in Tables 3 and 4.

(Half-Softening Temperature Ratio)

The half-softening temperature was evaluated by obtaining an isochrone softening curve based on the tensile strength after one hour of the heat treatment in conformity with JCBA T325:2013 of Japan Copper and Brass Association. Further, the tensile strength was measured in the same manner as that for the mechanical characteristics, that is, #13B test pieces specified in JIS Z 2241 were collected, and the tensile strength was measured in the direction parallel to the rolling direction and the direction transverse to the rolling direction by the offset method in JIS Z 2241.

Next, the half-softening temperature obtained above was converted to kelvin, and the half-softening temperature ratio $T_{LD}/T_{TD}$ was calculated from the half-softening temperature $T_{LD}$ obtained by performing the tensile test in the direction parallel to the rolling direction and the half-softening temperature $T_{TD}$ obtained by performing the tensile test in the direction transverse to the rolling direction.

The half-softening temperature ratio $T_{LD}/T_{TD}$ and the half-softening temperature $T_{LD}$ obtained by performing the tensile test in the direction parallel to the rolling direction are listed in Tables 3 and 4.

TABLE 1

| | | Component composition (mass ratio) | | | | | | | | | | | |
|---|---|---|---|---|---|---|---|---|---|---|---|---|---|
| | | | | | | Impurities | | | | | | | |
| | | Mg ppm | Ag ppm | S ppm | P ppm | Se ppm | Te ppm | Sb ppm | Bi ppm | As ppm | Cu | [S + P + Se + Te + Sb + Bi + As] ppm | [Mg]/[S + P + Se + Te + Sb + Bi + As] |
| Invention Examples | 1 | 11 | 16.0 | 3.1 | 3.1 | 2.1 | 2.0 | 2.1 | 2.0 | 2.1 | Balance | 16.5 | 0.7 |
| | 2 | 29 | 19.0 | 4.5 | 4.9 | 2.1 | 2.1 | 2.3 | 2.3 | 2.1 | Balance | 20.3 | 1.4 |
| | 3 | 42 | 7.0 | 0.5 | 0.4 | 0.2 | 0.2 | 0.2 | 0.2 | 0.2 | Balance | 1.9 | 22.1 |
| | 4 | 53 | 22.0 | 8.0 | 8.9 | 2.6 | 2.4 | 2.6 | 2.4 | 2.4 | Balance | 29.3 | 1.8 |
| | 5 | 65 | 16.0 | 4.5 | 4.6 | 2.1 | 2.8 | 2.6 | 2.6 | 2.4 | Balance | 21.6 | 3.0 |
| | 6 | 73 | 8.0 | 2.1 | 1.5 | 1.6 | 1.2 | 1.3 | 1.2 | 1.3 | Balance | 10.2 | 7.2 |
| | 7 | 81 | 6.0 | 0.5 | 0.4 | 0.2 | 0.2 | 0.2 | 0.1 | 0.1 | Balance | 1.7 | 47.6 |
| | 8 | 99 | 17.0 | 4.5 | 4.6 | 3.4 | 3.6 | 3.1 | 3.0 | 3.2 | Balance | 25.4 | 3.9 |
| | 9 | 12 | 8.0 | 0.3 | 0.8 | 0.8 | 0.8 | 0.8 | 0.8 | 0.8 | Balance | 5.1 | 2.4 |
| | 10 | 25 | 16.0 | 2.3 | 2.2 | 1.8 | 1.9 | 1.7 | 1.6 | 1.6 | Balance | 13.1 | 1.9 |
| | 11 | 39 | 8.0 | 2.6 | 2.6 | 1.2 | 1.2 | 1.0 | 1.3 | 1.3 | Balance | 11.2 | 3.5 |
| | 12 | 45 | 10.0 | 2.1 | 2.0 | 0.3 | 0.3 | 0.5 | 0.5 | 0.6 | Balance | 6.3 | 7.1 |
| | 13 | 51 | 12.0 | 0.4 | 0.4 | 1.3 | 1.3 | 1.3 | 1.2 | 1.3 | Balance | 7.2 | 7.1 |
| | 14 | 67 | 7.0 | 0.5 | 0.3 | 0.3 | 0.3 | 0.2 | 0.2 | 0.2 | Balance | 2.0 | 33.5 |
| | 15 | 84 | 9.0 | 2.1 | 2.6 | 1.1 | 1.0 | 1.2 | 1.2 | 1.2 | Balance | 10.4 | 8.1 |
| | 16 | 99 | 18.0 | 4.2 | 4.5 | 3.5 | 3.8 | 3.8 | 3.7 | 3.5 | Balance | 27.0 | 3.7 |

TABLE 2

| | | Component composition (mass ratio) | | | | | | | | | | | |
|---|---|---|---|---|---|---|---|---|---|---|---|---|---|
| | | | | | | Impurities | | | | | | | |
| | | Mg ppm | Ag ppm | S ppm | P ppm | Se ppm | Te ppm | Sb ppm | Bi ppm | As ppm | Cu | [S+ P+ Se+ Te + Sb + Bi + As] ppm | [Mg]/[S + P + Se + Te + Sb + Bi + As] |
| Invention Examples | 17 | 12 | 12.0 | 4.5 | 4.6 | 1.5 | 1.6 | 1.4 | 1.4 | 1.5 | Balance | 16.5 | 0.7 |
| | 18 | 21 | 16.0 | 3.6 | 3.2 | 2.1 | 2.5 | 2.3 | 2.3 | 2.4 | Balance | 18.4 | 1.1 |
| | 19 | 34 | 15.0 | 3.6 | 3.4 | 2.4 | 2.5 | 2.5 | 2.6 | 2.6 | Balance | 19.6 | 1.7 |
| | 20 | 53 | 24.0 | 1.3 | 1.6 | 0.1 | 0.2 | 0.2 | 0.3 | 0.3 | Balance | 4.0 | 13.4 |
| | 21 | 61 | 13.0 | 5.3 | 5.4 | 3.1 | 2.9 | 2.8 | 2.8 | 2.6 | Balance | 24.9 | 2.4 |
| | 22 | 76 | 19.0 | 2.0 | 2.2 | 0.5 | 0.5 | 0.5 | 0.6 | 0.6 | Balance | 6.9 | 11.0 |
| | 23 | 81 | 7.0 | 0.4 | 0.4 | 0.3 | 0.2 | 0.2 | 0.1 | 0.1 | Balance | 1.7 | 47.6 |
| | 24 | 98 | 19.0 | 5.6 | 5.2 | 2.1 | 2.5 | 2.6 | 2.4 | 2.6 | Balance | 23.0 | 4.3 |
| Comparative Example | 1 | 7 | 7.0 | 1.2 | 1.2 | 0.7 | 0.9 | 0.6 | 0.6 | 0.6 | Balance | 5.8 | 1.2 |
| | 2 | 2342 | 19.0 | 4.5 | 4.3 | 1.2 | 1.6 | 1.6 | 1.5 | 1.5 | Balance | 16.2 | 144.6 |
| | 3 | 59 | 18.0 | 7.1 | 7.2 | 3.5 | 3.6 | 3.3 | 3.5 | 3.2 | Balance | 31.4 | 1.9 |
| | 4 | 14 | 12.0 | 5.4 | 5.6 | 3.1 | 3.2 | 3.2 | 3.4 | 3.4 | Balance | 27.3 | 0.5 |
| | 5 | 64 | 8.0 | 3.4 | 3.2 | 2.1 | 2.1 | 2.2 | 2.0 | 2.4 | Balance | 17.4 | 3.7 |

TABLE 3

| | | Producing step | | | | | | Evaluation | | | | | |
|---|---|---|---|---|---|---|---|---|---|---|---|---|---|
| | | Rough working Rolling rate % | Finish working Rolling rate % | Mechanical surface treatment | Finish heat treatment | | Thickness mm | Brass orientation % | Electrical conductivity % IACS | $TS_{TD}/TS_{LD}$ | $T_{LD}/T_{TD}$ | Tensile strength $TS_{LD}$ MPa | Half-softening temperature $T_{LD}$ °C. |
| | | | | | Temperature °C. | Time sec. | | | | | | | |
| Invention Examples | 1 | 70 | 20 | Shot peening treatment | 390 | 5 | 5.0 | 6.1 | 99.5 | 0.97 | 1.04 | 258 | 213 |
| | 2 | 90 | 15 | Shot peening treatment | 250 | 180000 | 2.0 | 3.1 | 99.0 | 0.96 | 1.05 | 244 | 245 |
| | 3 | 70 | 30 | Shot peening treatment | 370 | 15 | 5.0 | 10.0 | 99.0 | 0.99 | 1.02 | 286 | 287 |
| | 4 | 80 | 5 | Shot peening treatment | 250 | 180000 | 5.0 | 0.7 | 98.8 | 0.93 | 1.07 | 212 | 324 |
| | 5 | 90 | 70 | Shot peening treatment | 250 | 180000 | 0.1 | 25.0 | 97.9 | 1.07 | 0.97 | 378 | 351 |
| | 6 | 90 | 0 | Shot peening treatment | 370 | 15 | 2.0 | 0.3 | 98.7 | 0.91 | 1.10 | 195 | 210 |
| | 7 | 60 | 20 | Shot peening treatment | 370 | 15 | 8.0 | 5.7 | 98.4 | 0.98 | 1.04 | 274 | 351 |
| | 8 | 30 | 50 | Shot peening treatment | 390 | 5 | 10.0 | 18.2 | 98.2 | 1.03 | 0.99 | 334 | 353 |
| | 9 | 90 | 15 | Grinder polishing | 370 | 15 | 2.0 | 3.2 | 99.8 | 0.95 | 1.05 | 247 | 212 |
| | 10 | 40 | 50 | Grinder polishing | 250 | 180000 | 8.0 | 18.3 | 99.4 | 1.05 | 0.99 | 332 | 249 |
| | 11 | 90 | 60 | Grinder polishing | 390 | 5 | 0.1 | 22.1 | 99.1 | 1.05 | 0.98 | 356 | 298 |
| | 12 | 40 | 40 | Grinder polishing | — | — | 10.0 | 15.2 | 99.1 | 1.01 | 1.00 | 312 | 275 |
| | 13 | 80 | 90 | Grinder polishing | 360 | 30 | 0.5 | 33.4 | 98.9 | 1.12 | 0.93 | 409 | 210 |
| | 14 | 60 | 65 | Grinder polishing | 250 | 180000 | 2.0 | 23.4 | 98.4 | 1.06 | 0.97 | 368 | 349 |
| | 15 | 50 | 60 | Grinder polishing | 350 | 60 | 5.0 | 20.7 | 97.8 | 1.05 | 0.98 | 357 | 354 |
| | 16 | 90 | 40 | Grinder polishing | 390 | 5 | 0.5 | 12.9 | 97.1 | 1.01 | 1.00 | 310 | 356 |

$T_{LD}$: half-softening temperature obtained by performing tensile test in direction parallel to rolling direction
$T_{TD}$: half-softening temperature obtained by performing tensile test in direction transverse to rolling direction
$TS_{TD}$: tensile strength in case of performing tensile test in direction transverse to rolling direction
$TS_{LD}$: tensile strength in case of performing tensile test in direction parallel to rolling direction

TABLE 4

| | | Producing step | | | | | | Evaluation | | | | | |
|---|---|---|---|---|---|---|---|---|---|---|---|---|---|
| | | Rough working Rolling rate % | Finish working Rolling rate % | Mechanical surface treatment | Finish heat treatment | | Thickness mm | Brass orientation % | Electrical conductivity % IACS | $TS_{TD}/TS_{LD}$ | $T_{LD}/T_{TD}$ | Tensile strength $TS_{LD}$ MPa | Half-softening temperature $T_{LD}$ °C. |
| | | | | | Temperature °C. | Time sec. | | | | | | | |
| Invention Examples | 17 | 40 | 50 | Sandpaper polishing | 390 | 5 | 8.0 | 18.4 | 99.9 | 1.04 | 0.99 | 331 | 211 |
| | 18 | 90 | 60 | Sandpaper polishing | — | — | 1.0 | 20.3 | 99.4 | 1.04 | 0.98 | 361 | 221 |
| | 19 | 90 | 20 | Sandpaper polishing | 360 | 30 | 2.0 | 4.7 | 99.6 | 0.98 | 1.04 | 259 | 289 |
| | 20 | 80 | 40 | Sandpaper polishing | 390 | 5 | 2.0 | 14.8 | 99.1 | 1.00 | 1.00 | 308 | 285 |
| | 21 | 90 | 75 | Sandpaper polishing | 250 | 180000 | 0.5 | 29.0 | 98.9 | 1.08 | 0.97 | 395 | 345 |
| | 22 | 40 | 50 | Sandpaper polishing | 370 | 15 | 8.0 | 15.0 | 98.5 | 1.03 | 0.99 | 333 | 358 |
| | 23 | 90 | 10 | Sandpaper polishing | 350 | 60 | 1.0 | 1.9 | 98.4 | 0.94 | 1.06 | 239 | 352 |
| | 24 | 60 | 15 | Sandpaper polishing | 390 | 5 | 10.0 | 3.5 | 98.3 | 0.95 | 1.05 | 250 | 354 |
| Comparative Example | 1 | 90 | 50 | Grinder polishing | 360 | 30 | 0.5 | 16.9 | 99.9 | 1.03 | 0.97 | 329 | 172 |
| | 2 | 40 | 40 | Grinder polishing | 390 | 5 | 8.0 | 15.1 | 83.1 | 1.02 | 0.99 | 418 | 412 |

TABLE 4-continued

| | Producing step | | | | | Evaluation | | | | | | |
|---|---|---|---|---|---|---|---|---|---|---|---|---|
| | Rough working Rolling | Finish working Rolling | Mechanical | Finish heat treatment | | Thick-ness | Brass orientation | Electrical conductivity | $TS_{TD}/$ | $T_{LD}/$ | $TS_{LD}$ | Half-softening temper- |
| | | | | | | | | | | Tensile strength | ature |
| | rate % | rate % | surface treatment | Temperature ° C. | Time sec. | mm | % | % IACS | $TS_{LD}$ | $T_{TD}$ | MPa | $T_{LD}$ ° C. |
| 3 | 90 | 30 | Grinder polishing | 250 | 180000 | 1.0 | 9.2 | 98.7 | 1.00 | 1.01 | 287 | 182 |
| 4 | 50 | 20 | Sandpaper polishing | 370 | 15 | 10.0 | 5.7 | 99.6 | 0.98 | 1.04 | 258 | 189 |
| 5 | 60 | 40 | — | 370 | 15 | 0.1 | 15.1 | 98.7 | 0.82 | 0.84 | 301 | 349 |

$T_{LD}$: half-softening temperature obtained by performing tensile test in direction parallel to rolling direction
$T_{TD}$: half-softening temperature obtained by performing tensile test in direction transverse to rolling direction
$TS_{TD}$: tensile strength in case of performing tensile test in direction transverse to rolling direction
$TS_{LD}$: tensile strength in case of performing tensile test in direction parallel to rolling direction In Comparative Example 1, since the amount of Mg was less than the range of the present embodiment, the half-softening temperature was low, and the heat resistance was insufficient.

In Comparative Example 2, since the amount of Mg was greater than the range of the present embodiment, the electrical conductivity was low.

In Comparative Example 3, the total amount of S, P, Se, Te, Sb, Bi, and As was greater than 30 mass ppm, and thus the half-softening temperature was low, and the heat resistance was insufficient.

In Comparative Example 4, since the mass ratio [Mg]/[S+P+Se+Te+Sb+Bi+As] was less than 0.6, the half-softening temperature was low, and the heat resistance was insufficient.

In Comparative Example 5, the mechanical surface treatment step was not performed, the half-softening temperature ratio $T_{LD}/T_{TD}$ was out of the range of the present invention, and the anisotropy in heat resistance was increased. Further, the strength ratio $TS_{TD}/TS_{LD}$ was also out of the range of the present invention, and the anisotropy in the strength was also increased.

On the contrary, in Invention Examples 1 to 24, it was confirmed that the electrical conductivity and the heat resistance were improved in a well-balanced manner, and the anisotropy in heat resistance and strength was small.

As described above, according to Invention Examples, it was confirmed that a copper alloy having high electrical conductivity, excellent heat resistance, and small anisotropy in heat resistance can be provided.

INDUSTRIAL APPLICABILITY

The copper alloy (plastically-worked copper alloy material) of the present embodiment is suitably applied to a component for electronic/electrical devices such as a terminal, a bus bar, a lead frame, or a heat dissipation substrate.

What is claimed is:

1. A copper alloy comprising:
   Mg in an amount of greater than 10 mass ppm and less than 100 mass ppm; and
   a balance being Cu and inevitable impurities, wherein the inevitable impurities comprise;
      S in an amount of 10 mass ppm or less,
      P in an amount of 10 mass ppm or less,
      Se in an amount of 5 mass ppm or less,
      Te in an amount of 5 mass ppm or less,
      Sb in an amount of 5 mass ppm or less,
      Bi in an amount of 5 mass ppm or less, and
      As in an amount of 5 mass ppm or less,
   a total amount of S, P, Se, Te, Sb, Bi, and As is 30 mass ppm or less, and
   when the amount of Mg is represented as [Mg] and the total amount of S, P, Se, Te, Sb, Bi, and As is represented as [S+P+Se+Te+Sb+Bi+As], a mass ratio thereof, [Mg]/[S+P+Se+Te+Sb+Bi+As] is 0.6 or greater and 50 or less,
   an electrical conductivity is 97% IACS or greater,
   a half-softening temperature ratio $T_{LD}/T_{TD}$ calculated from a half-softening temperature $T_{LD}$ obtained by performing a tensile test in a direction parallel to a rolling direction and a half-softening temperature $T_{TD}$ obtained by performing a tensile test in a direction transverse to the rolling direction is greater than 0.95 and less than 1.08, and
   the half-softening temperature $T_{LD}$ obtained by performing the tensile test in a direction parallel to a rolling direction is 210° C. or higher.

2. The copper alloy according to claim 1, further comprising:
   Ag in an amount of 5 mass ppm or greater and 20 mass ppm or less.

3. The copper alloy according to claim 1,
   wherein an area ratio of crystals having a crystal orientation which is 100 or less with respect to Brass orientation {110} <112> is 30% or less.

4. The copper alloy according to claim 1,
   wherein a strength ratio $TS_{TD}/TS_{LD}$ calculated from a tensile strength $TS_{TD}$ in a case of performing a tensile test in the direction transverse to the rolling direction and a tensile strength $TS_{LD}$ in a case of performing a tensile test in the direction parallel to the rolling direction is greater than 0.93 and less than 1.10, and
   a tensile strength $TS_{LD}$ in a case of performing a tensile test in the direction parallel to the rolling direction is 200 MPa or greater.

5. A plastically-worked copper alloy material comprising: the copper alloy according to claim 1.

6. The plastically-worked copper alloy material according to claim 5,
   wherein the plastically-worked copper alloy material is a rolled plate having a thickness of 0.1 mm or greater and 10 mm or less.

7. The plastically-worked copper alloy material according to claim 5, wherein the plastically-worked copper alloy material includes a Sn plating layer or an Ag plating layer on a surface thereof.

8. A component for electronic/electrical devices, comprising:
the plastically-worked copper alloy material according to claim 5.

9. A terminal comprising:
the plastically-worked copper alloy material according to claim 5.

10. A bus bar comprising:
the plastically-worked copper alloy material according to claim 5.

11. A lead frame comprising:
the plastically-worked copper alloy material according to claim 5.

12. A heat dissipation substrate which is prepared by using the copper alloy according to claim 1.

13. The copper alloy according to claim 1, wherein the amount of Mg is greater than 10 mass ppm and less than 50 mass ppm.

* * * * *